(12) United States Patent
Semyonov et al.

(10) Patent No.: US 11,352,557 B2
(45) Date of Patent: Jun. 7, 2022

(54) SEMICONDUCTOR LIGHT EMITTING NANOPARTICLE

(71) Applicant: Merck Patent GmbH, Darmstadt (DE)

(72) Inventors: Artyom Semyonov, Rehovot (IL); Ehud Shaviv, Modi'in (IL)

(73) Assignee: Merck Patent GmbH, Darmstadt (DE)

( * ) Notice: Subject to any disclaimer, the term of this patent is extended or adjusted under 35 U.S.C. 154(b) by 15 days.

(21) Appl. No.: 16/755,179

(22) PCT Filed: Oct. 10, 2018

(86) PCT No.: PCT/EP2018/077546
§ 371 (c)(1),
(2) Date: Apr. 10, 2020

(87) PCT Pub. No.: WO2019/072884
PCT Pub. Date: Apr. 18, 2019

(65) Prior Publication Data
US 2021/0214606 A1    Jul. 15, 2021

(30) Foreign Application Priority Data
Oct. 13, 2017 (EP) .................... 17196436

(51) Int. Cl.
| C09K 11/02 | (2006.01) |
| C09K 11/08 | (2006.01) |
| C09K 11/88 | (2006.01) |
| B82Y 20/00 | (2011.01) |
| B82Y 40/00 | (2011.01) |
| H01L 33/50 | (2010.01) |

(52) U.S. Cl.
CPC ........ *C09K 11/025* (2013.01); *C09K 11/0883* (2013.01); *C09K 11/883* (2013.01); *B82Y 20/00* (2013.01); *B82Y 40/00* (2013.01); *H01L 33/502* (2013.01)

(58) Field of Classification Search
CPC . C09K 11/025; C09K 11/0885; C09K 11/883; B82Y 20/00; B82Y 30/00; B82Y 40/00
See application file for complete search history.

(56) References Cited

U.S. PATENT DOCUMENTS

| 9,061,903 B2 * | 6/2015 | Tulsky ................ C09B 68/4257 |
| 10,224,398 B2 | 3/2019 | Bartel et al. |
| 2012/0205598 A1 | 8/2012 | Li et al. |
| 2015/0014629 A1 * | 1/2015 | Breen ................. H01L 21/0256 257/14 |
| 2015/0021551 A1 | 1/2015 | Breen et al. |

FOREIGN PATENT DOCUMENTS

| WO | WO 2012/092178 | * 7/2012 |

OTHER PUBLICATIONS

International Search Report PCT/EP2018/77546 dated Dec. 19, 2018 (pp. 1-4).
Raquel Gomes et al: "Binding of Phosphonic Acids to CdSe Quantum Dots: A Solution NMR Study", Journal of Physical Chemistry Letters, vol. 2, No. 3, Jan. 7, 2011 (Jan. 7, 2011), US, pp. 145-152, XP055526944, ISSN: 1948-7185.
Peng et al.: "Formation of High Quaiity CdTe, CdSe, and CdS Nanocrystals using CdO as Precursor" Journal of American Chemical Society, vol. 123, No. 1, 2001, pp. 183-184.
Tang et al. : Colloidal-quantum-dot photovoltaics using atomic-ligand passivation; Nature Materials, vol. 10, 2011, pp. 765-771.

\* cited by examiner

*Primary Examiner* — C Melissa Koslow
(74) *Attorney, Agent, or Firm* — Millen, White, Zelano and Branigan, P.C.; Harry B. Shubin

(57) ABSTRACT

The present invention relates to a method for preparing a nanosized light emitting semiconductor material.

18 Claims, No Drawings

SEMICONDUCTOR LIGHT EMITTING NANOPARTICLE

FIELD OF THE INVENTION

The present invention refers to the area of semiconductors and relates to new quantum dots with improved quantum yields and reduced trap emission, a process for obtaining them and further applications of the new semiconductors.

BACKGROUND ART

Quantum dots (QD) are semiconducting particles with diameters in the nanometre range (about 2 to 20 nm), which are so small that the optical and electronic properties of the crystals change. A special feature of the Quantum dots is that they change their colour with the particle diameter. In order to produce, for example, blue QDs, no other materials are required as for red QDs they only have to be produced with different particle sizes and/or different composition. In addition to typical applications such as displays, QDs are now also used in many other areas, such as solar cells or processors.

Quantum dots can fluoresce and convert photons to other wavelengths as well as emit light. However, their outstanding characteristics are undoubtedly the ability to improve the background lighting in displays. LCD TVs use a white background light and then filter the blue, green and red light to display colours. Blue LEDs with a phosphor layer are usually used for this so-called "backlight".

The strongest technological advantage of QD backlight over phosphor based "white LED" backlight is the narrow FWHM (<50 nm) which enables wide colour gamut, e.g. increasing the amount of displayed colours. Some phosphor films can give EQE as high as >90%, comparable to EQE of QD films.

The most important semiconductor materials, which are also suitable for the production of Quantum Dots, include cadmium compounds, especially CdS and CdSe. However, the disadvantage is that cadmium is highly toxic. A promising alternative would be InP, but here the quantum yield is not satisfactory. Therefore, the search is ongoing for specific new ligands improving quantum of QDs, particularly by reducing trap emission.

Metallic complexes with phosphonates are widely used as precursors during the synthesis of Cd-based semiconductor nanocrystals. Such precursors are used to make nanorods since they induce anisotropic growth. For example it is described in *Nature Materials* 10, 765-771 (2011) and in *Journal of American Chemical Society*, 123 (1), p. 183-184, 2001 to use the following phosphonates as precursors: Cd-octadecylphosphonate, Cd-hexylphosphonate and Cd-tetradecylphosphonate.

Furthermore metallic complexes with phosphonates are used as precursors for shell growth providing elements of e.g. ZnS, ZnSe shell upon a CdSe core as reported for example in US 2012/0205598 A1. It should be mentioned that the metal phosphonates are used as precursors for ZnS and were decomposed at elevated temperatures, while metal phosphonates are not mentioned for surface treatment after the synthesis is complete or as a ligand.

It is also known from the paper J. Phys. Chem. Lett. 2011, 2, 145-152 that phosphonate acids are useful as QDs capping ligands. The documents, however, are silent with respect to specific metal complexes of these compounds and their ability to passivate traps when bound to the outer surface of a QD.

Therefore it has been the object of the present invention to provide new semiconductor light emitting materials with improved quantum yields.

DESCRIPTION OF THE INVENTION

A first object of the present invention is directed to a semiconductor nano-sized light emitting material comprising or consisting of a core, optionally one or more shell layers and a ligand coated onto the core or the outermost surface of the shell layers, wherein the ligand is one or more metal phosphonate and/or derivatives thereof, and wherein the metal phosphonate follows one of the following structures according to formula (I), (II), (III), (IV) and/or (V),

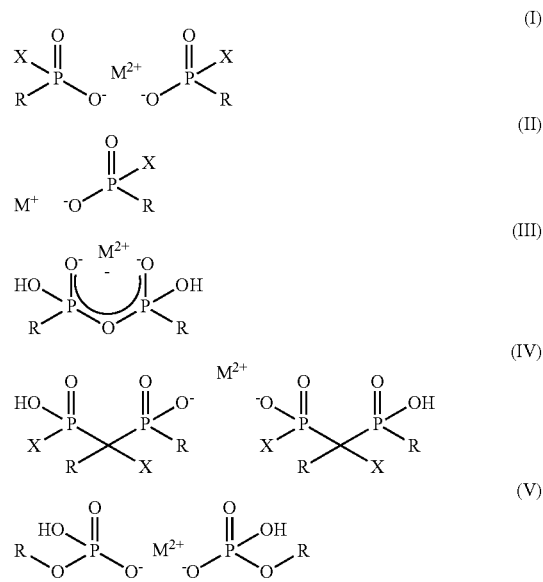

wherein R is selected from the group consisting of alkyl, alkenyl, alkynyl, aryl and alkylaryl and wherein R comprises at least 2 and not more than 20 carbon atoms, and wherein X is selected from the group consisting of hydroxyl, ester and ether.

Surprisingly, it has been observed that deposition of ligands of metal phosphonate type and/or derivatives thereof, which are capable of replacing native ligands and coordinating to both positive and negative atoms in quantum material's surface, passivate the traps on the surface of the particles, thus leading to a significant increase of up to 60% in quantum yields, improved QY stability and overcomes the drawbacks of the prior art. The effect can further increased by subsequently illuminating these materials.

According to the present invention, the term "semiconductor" means a material that has electrical conductivity to a degree between that of a conductor (such as copper) and that of an insulator (such as glass) at room temperature. Preferably, a semiconductor is a material whose electrical conductivity increases with the temperature.

The term "nanosized" means the size in between 0.1 nm and 999 nm, preferably 1 nm to 150 nm, more preferably 3 nm to 50 nm.

Thus, according to the present invention, "semiconducting light emitting nanoparticle" is taken to mean that the light emitting material which size is in between 0.1 nm and 999 nm, preferably 1 nm to 150 nm, more preferably 3 nm to 50 nm, having electrical conductivity to a degree between that of a conductor (such as copper) and that of an insulator (such as glass) at room temperature, preferably, a semiconductor is a material whose electrical conductivity increases with the temperature, and the size is in between 0.1 nm and 999 nm, preferably 0.5 nm to 150 nm, more preferably 1 nm to 50 nm.

According to the present invention, the term "size" means the average diameter of the longest axis of the semiconducting nanosized light emitting particles.

The average diameter of the semiconducting nanosized light emitting particles are calculated based on 100 semiconducting light emitting nanoparticles in a TEM image created by a Tecnai G2 Spirit Twin T-12 Transmission Electron Microscope.

In a preferred embodiment of the present invention, the semiconducting light emitting nanoparticle of the present invention is a quantum sized material.

According to the present invention, the term "quantum sized" means the size of the semiconducting material itself without ligands or another surface modification, which can show the quantum confinement effect, like described in, for example, ISBN:978-3-662-44822-9.

Generally, it is said that the quantum sized materials can emit tunable, sharp and vivid colored light due to "quantum confinement" effect.

In some embodiments of the invention, the size of the overall structures of the quantum sized material, is from 1 nm to 50 nm, more preferably, it is from 1 nm to 30 nm, even more preferably, it is from 5 nm to 15 nm.

According to the present invention, said core of the semiconducting light emitting nanoparticle can be varied. For example, CdS, CdSe, CdTe, ZnS, ZnSe, ZnSeS, ZnTe, ZnO, GaAs, GaP, GaSb, HgS, HgSe, HgSe, HgTe, InAs, InP, InPS, InPZnS, InPZn, InPZnSe, InCdP, InPCdS, InPCdSe, InGaP, InGaPZn, InSb, AlAs, AlP, AlSb, $Cu_2S$, $Cu_2Se$, $CuInS_2$, $CuInSe_2$, $Cu_2(ZnSn)S_4$, $Cu_2(InGa)S_4$, $TiO_2$ and a combination of any of these can be used. The terms "metal phosphonate" and "metal phosphonates" as used herein are interchangeable and include any phosphonate and/or derivatives thereof with a metal cation. Examples of suitable metal cations are listed below.

A second object of the present invention is directed to a semiconductor nano-sized light emitting material comprising or consisting of a core, optionally one or more shell layers and a ligand coated onto the core or the outermost surface of the shell layers, obtainable or obtained by the following steps:
(a) providing at least one salt of at least one metal [$A^1$] and/or [$A^2$] optionally dissolved in a suitable solvent;
(b) adding at least one source of at least one non-metal [$B^1$] and/or [$B^2$] to obtain an intermediate compound [$A^1B^1$]/[$A^2B^2$];
(c) coating said intermediate compound [$A^1B^1$]/[$A^2B^2$] from step (b), optionally in the presence of a solvent, by bringing it into contact with a source of a metal phosphonate acid and/or derivatives thereof, wherein the metal phosphonate follows one of the following structures according to formula (I), (II), (III), (IV) and/or (V)

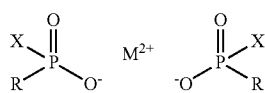

(I)

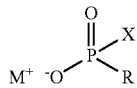

(II)

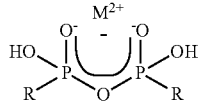

(III)

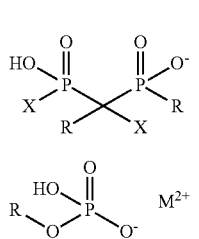

(IV)

(V)

and optionally
(d) subjecting said coated intermediate of step (c) to illumination with light with a peak light wavelength of about 300 to about 650 nm to increase quantum yield of the nano-sized material.

It should be noted that said ligands can be added to crude material, which means that they are incorporated into the last step of the QD synthesis, but is also possible to use commercial QDs for after-treatment. The materials may have any possible shape, such as for example rods, dots, octahedrals, wires, tetrapods, platelets and the like.

Metal Phosphonates and Derivatives Thereof

"Phosphonate acids" are organophosphorus compounds containing C—PO(OH)2 or C—PO(OR)2 groups. Phosphonate acids, typically handled as salts, are generally nonvolatile solids that are poorly soluble in organic solvents, but soluble in water and common alcohols.

Phosphonate acids can be alkylated under "Mannich conditions" to give amino methylated phosphonates, which are useful as complexants. One example is the industrial preparation of nitrilotris (methylene phosphonic acid):

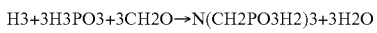

Phosphonate acids also can be alkylated with acrylic acid derivatives to afford carboxyl functionalized phosphonate acids. This reaction is a variant of the Michael addition:

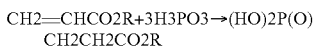

For example, phosphonate esters are prepared using the "Michaelis-Arbuzov reaction". For example, methyl iodide catalyses the conversion of trimethylphosphite to the phosphonate ester dimethyl methylphosphonate:

In the "Michaelis-Becker reaction", a hydrogen phosphonate diester is first deprotonated and the resulting anion is alkylated.

These preparation examples are intended only to give an indication of how the phosphonates according to the invention can be manufactured. The above cited examples therefore are not limiting examples according to the present invention. Other methods of manufacture are well known to the person skilled in the art and are described in the literature.

Preferably said metal phosphonates follow formula (I), (II), (III), (IV) and/or (V)

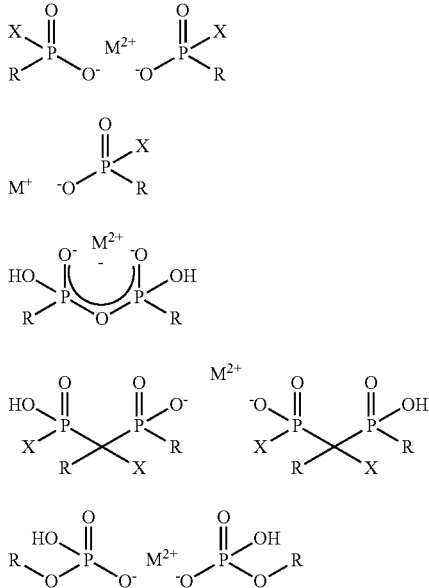

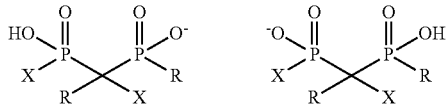

Structure IV: Example of di-phosphonates 1

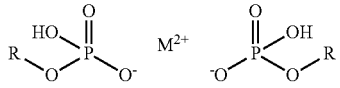

Structure V: Example of di-phosphonates 2 wherein R is selected from the group consisting of alkyl, alkenyl, alkynyl, aryl and alkylaryl and wherein R comprises at least 2 and not more than 20 carbon atoms, and wherein X is selected from the group consisting of hydroxyl, ester and ether.

In some embodiments of the present invention R further comprises at least one functional group selected from the group consisting of hydroxyl, carbonyl, carboxyl, ether, ester, amino, thio, silyl, sulfo and halogen. Preferably said metal phosphonates follow formula (I) and/or (II).

The metal cation used for the metal phosphonate is selected from the group consisting of: Mg, Ca, Ba, Cu, Fe, Zn or their mixtures. Preferably the metal cation used for the metal phosphonate is Mg and/or Zn. In the most preferred embodiment the metal cation used for the metal phosphonate is Zn.

The preferred ligands may have the general structures (structure I, II, III, IV and V):

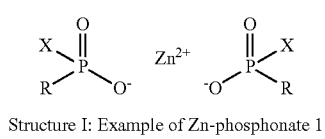

Structure I: Example of Zn-phosphonate 1

Structure II: Example of Zn-phosphonate 2

Structure III: Zn-phosphonate anhydride

Commonly used suitable metal phosphonates include, but are not limited to Zn-Octadecylphosphonate, Zn-Hexadecylphosphoanate, Zn-Tetradecylphosphoanate, Zn-tetraethyl methylenediphosphonate, and mixtures thereof.

In some embodiments the phosphonate group of formula (I), (II), (III), (IV) and/or (V) can be replaced by a phosphate group derivative.

It should be noted that the presence of a bivalent metal, as metal cation, in particular zinc, is crucial for the invention. Note that in the absence of such metals phosphonates exhibit rather low quantum yields.

The preferred ligands represent Zn-phosphonates and/or derivatives thereof, representing so-called Z-type ligands as defined in NATURE MATERIALS 15, pp 141-153 (2016).

Semiconductor Materials

Suitable semiconductor materials forming the core or the core/shell body of the material according to the present invention may represent single compounds or mixtures of two, three or even more of them.

In a first preferred embodiment of the present invention said core is formed from one, two or more compounds according to formula (VI)

$$[A^1B^1] \quad (VI)$$

in which
[$A^1$] stands for a metal selected from the group consisting of zinc, cadmium, indium or their mixtures;
[$B^1$] stands for a non-metal selected form the group consisting of sulphur, selenium, phosphorus or their mixtures.

More preferably [$A^1B^1$] stands for one, two or more compounds selected from the group consisting of CdS, CdSe, CdSeS, CdZnS, ZnS, ZnSe, ZnSeS, and InP.

In a most preferred embodiment of the present invention [$A^1$] stands for indium; and
[$B^1$] stands for phosphorous.

According to the present invention, a type of shape of the core of the semiconducting light emitting nanoparticle, and shape of the semiconducting light emitting nanoparticle to be synthesized are not particularly limited.

For examples, spherical shaped, elongated shaped, star shaped, polyhedron shaped, pyramidal shaped, tetrapod shaped, tetrahedron shaped, platelet shaped, cone shaped, and irregular shaped core and-or a semiconducting light emitting nanoparticle can be synthesized.

In some embodiments of the present invention, the average diameter of the core is in the range from 1.5 nm to 3.5 nm.

In another preferred embodiment of the present invention said shell or said shells are formed from one, two or more compounds according to formula (VII), $$[A^2B^2] \quad (VII)$$

in which
[$A^2$] stands for a metal selected from the group consisting of zinc, cadmium or their mixtures;
[$B^2$] stands for a non-metal selected form the group consisting of sulphur, selenium, tellurium or their mixtures.

Preferably [$A^2B^2$] stands for one, two or more compounds selected from the group consisting of CdS, CdSe, CdSeS, CdZnS, ZnS, ZnSe, ZnTe, ZnTeSeS and ZnSeS.

In a most preferred embodiment of the present invention [$A^2$] stands for zinc; and
[$B^2$] stands for selenium.

Overall preferred are materials comprise a core shell structure of the core [$A^1B^1$] and at least one shell [$A^2B^2$], said core/shell structure [$A^1B^1$]/[$A^2B^2$] being selected from the group consisting of
CdSeS/CdZnS
CdSe/ZnS
InP/ZnS
InP/ZnSe
InP(Zn)/ZnSe
ZnSe/CdS
ZnSe/ZnS or their mixtures.

In another preferred embodiment of the present invention the materials are free of cadmium.

In a most preferred embodiment of the present invention the semiconductor nano-sized light emitting materials comprise a core [$A^1B^1$] and at least one shell [$A^2B^2$], wherein
[$A^1$] stands for indium;
[$B^1$] stands for phosphorous;
[$A^2$] stands for zinc; and
[$B^2$] stands for selenium.

the semiconducting light emitting nanoparticle further comprises a 2nd shell layer onto said shell layer, preferably the 2nd shell layer comprises or a consisting of a 3rd element of group 12 of the periodic table and a 4th element of group 16 of the periodic table, more preferably the 3rd element is Zn, and the 4th element is S, Se, or Te with the proviso that the 4th element and the 2nd element are not the same.

In a preferred embodiment of the present invention, the 2nd shell layer is represented by following formula (IX), $$ZnS_xSe_yTe_z, \quad (IX)$$

wherein the formula (IX), $0 \le x \le 1$, $0 \le y \le 1$, $0 \le z \le 1$, and $x+y+z=1$, preferably, the shell layer is ZnSe, ZnSxSey, ZnSeyTez, or ZnSxTez with the proviso that the shell layer and the 2nd shell layer is not the same.

In some embodiments of the present invention, said 2nd shell layer can be an alloyed shell layer or a graded shell layer, preferably said graded shell layer is ZnSxSey, ZnSeyTez, or ZnSxTez, more preferably it is ZnSxSey. In some embodiments of the present invention, the semiconducting light emitting nanoparticle can further comprise one or more additional shell layers onto the 2nd shell layer as a multishell.

According to the present invention, the term "multishells" stands for the stacked shell layers consisting of three or more shell layers.

As examples of core/shell layers, CdSe/CdS, CdSeS/CdZnS, CdSeS/CdS/ZnS, ZnSe/CdS, CdSe/ZnS, InP/ZnS, InP/ZnSe, InP/ZnSe/ZnS, InZnP/ZnS, InZnP/ZnSe, InZnP/ZnSe/ZnS, InGaP/ZnS, InGaP/ZnSe, InGaP/ZnSe/ZnS, InZnPS/ZnS, InZnPS/ZnSe, InZnPS/ZnSe/ZnS, ZnSe/CdS, ZnSe/ZnS or combination of any of these, can be used. Preferably, InP/ZnS, InP/ZnSe, InP/ZnSe$_x$S$_{1-x}$InP/ZnSe$_x$S$_{1-x}$/ZnS, InP/ZnSe/ZnS, InZnP/ZnS, InP/ZnSe$_x$Te$_{1-x}$/ZnS, InP/ZnSe$_x$Te$_{1-x}$InZnP/ZnSe, InZnP/ZnSe/ZnS, InGaP/ZnS, InGaP/ZnSe, InGaP/ZnSe/ZnS.

Manufacturing Process

Another object of the present invention is directed to a process for manufacturing a semiconductor nano-sized light emitting material comprising or consisting of a core, optionally one or more shell layers and metal phosphonates and/or derivatives thereof coated onto the core or the outermost surface of the shell layers, comprising or consisting of the following steps:

(a) providing at least one salt of at least one metal [$A^1$] and/or [$A^2$] optionally dissolved in a suitable solvent;
(b) adding at least one source of at least one non-metal [$B^1$] and/or [$B^2$] to obtain an intermediate compound [$A^1B^1$] or [$A^1B^1$]/[$A^2B^2$];
(c) coating said intermediate compound [$A^1B^1$]/[$A^2B^2$] from step (b), optionally in the presence of a solvent, by bringing it into contact with a source of metal phosphonates and/or derivatives thereof, and optionally
(d) subjecting said coated intermediate of step (c) to illumination with light with a peak light wavelength of about 300 to about 650 nm to increase quantum yield of the nano-sized material.

Therefore, the present invention includes two alternative embodiments for the materials: the first is a structure consisting of a [$A^1B^1$] as a single core on which the ligand is deposited and the second is a structure consisting of a core [$A^1B^1$] and at least one shell [$A^2B^2$], preferably two or more shells [$A^2B^2$]$^2$ to [$A^xB^x$]$^x$. In case the materials consist of a core and at least one shell, core material [$A^1B^1$] and [$A^2B^2$] are different, for example InP as the core and ZnSe forming a shell. In case there are more shells, the materials may be still different, such as for example InP/ZnS, ZnSe, however it also possible that core and for example the outer shell are identical, e.g. ZnS/ZnSe, ZnS.

Therefore, a preferred embodiment of the present invention is a process wherein step (a) and/or step (b) encompasses providing salts of two different metals [$A^1$] or [$A^2$] and/or adding sources of two different non-metals [$B^1$] or [$B^2$] respectively. In case all raw materials are added at the same time a core consisting of all these compounds is formed. However, it is particularly preferred forming the core first and subsequently adding those components designated to form a shell around said core. This can be done stepwise to build up complex particles with a core and two or more shells.

For example, suitable salts of metal [$A^1$] or [$A^2$] encompass halides, particularly chlorides or iodides, or carboxylates, such as for example acetates or oleates. Suitable sources of non-metals [$B^1$] or [$B^2$] comprise for example Tris(trimethylsilyl)phosphine. The molar ratio of these components [A] and [B] can differ in wide ranges, however it is preferred to apply molar ratios in the range of about 5:1 to 1:5, preferably about 2:1 to 1:2 and particularly about 1:1.

Reaction usually takes place in the presence of a solvent, for example a high-boiling amine like oleyl amine. Once the components to form the core are brought into contact they were kept under reflux at a temperature of about 150 to about 250° C. Subsequently the remaining components designated to form the shell are introduced an temperature increased stepwise up to 350° C., preferably 200 to 320° C. The complete reaction requires up to 5 hours.

Once reaction is completed the intermediate semiconductor material [AB]—either consisting of a single core or showing a core-shell(s) structure—is purified by washing and centrifugation using polar and non-polar solvents. Subsequently the nanocrystals are dissolved or at least dispersed in an organic solvent (e.g. toluene) and treated with a solution of a metal phosphonate and/or derivatives thereof as defined in detail above.

The metal phosphonates and/or derivatives thereof are deposited on the surface of the intermediate compound $[A^1B^1]$ or $[A^1B^1]/[A^2B^2]$ in an amount of from about 2 to about 98 wt. %, based on the total solid content of the sample, which is the weight of QD and ligand, more preferably from about 3 to about 50 wt. % and even more preferably from about 5 to about 25 wt. %, which may depend on the molar mass of the ligand.

A critical step for producing the new materials is illumination using blue light. Preferred peak light wavelengths range from about 300 to about 650 nm and particularly from about 365 about 470 nm. In another preferred embodiment light intensities range from about 0.025 to about 1 Wcm$^{-2}$, more preferably from about 0.05 to about 0.5 Wcm$^{-2}$.

PREFERRED EMBODIMENTS

A preferred embodiment of the present invention is a metal phosphonate which follows formula (I), (II), (III), (IV) and/or (V), preferably said at least one metal phosphonate follows formula (I) and/or (II).

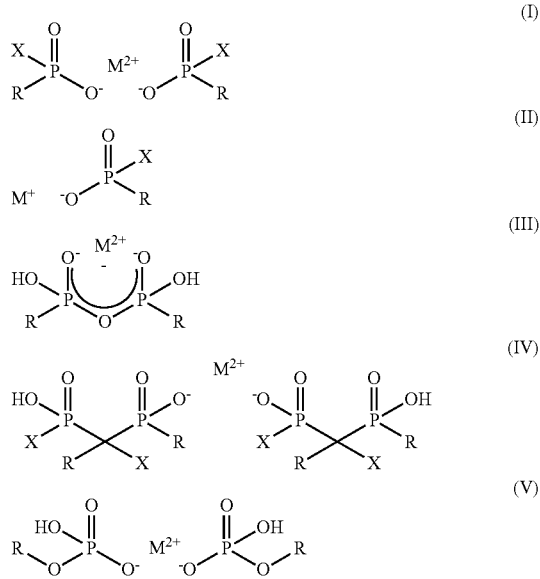

wherein R is selected from the group consisting of alkyl, alkenyl, alkynyl, aryl and alkylaryl and wherein R comprises at least 2 and not more than 20 carbon atoms, and wherein X is selected from the group consisting of hydroxyl, ester and ether; and wherein the metal cation is Zn.

In a further preferred embodiment of the present invention the metal cation used for the metal phosphonate is Zn and the semiconductor nano-sized light emitting materials comprise a core $[A^1B^1]$ and at least one shell $[A^2B^2]$, wherein
 [A$^1$] stands for indium;
 [B$^1$] stands for phosphorous;
 [A$^2$] stands for zinc; and
 [B$^2$] stands for selenium.

Matrix Composition

Another object of the present invention refers to a composition comprising at least one semiconductor nano-sized light emitting material as explained above and at least one additional material, preferably the additional material is selected from the group consisting of organic light emitting materials, inorganic light emitting materials, charge transporting materials, scattering particles, and matrix materials, preferably the matrix materials are optically transparent polymers. Preferably the matrix materials are optically transparent polymers.

According to the present invention, a wide variety of publically known matrix materials suitable for optical devices can be used preferably. In a preferred embodiment according to the invention the matrix material used is transparent.

According to the present invention, the term "transparent" means at least around 60% of incident light transmit at the thickness used in an optical medium and at a wavelength or a range of wavelength used during operation of an optical medium. Preferably, it is over 70%, more preferably, over 75%, the most preferably, it is over 80%.

In a preferred embodiment of the present invention, as said matrix material, any type of publically known transparent matrix material, described in for example, WO 2016/134820A can be used.

In some embodiments of the present invention, the transparent matrix material can be a transparent polymer.

According to the present invention the term "polymer" means a material having a repeating unit and having the weight average molecular weight (Mw) 1000 or more. The molecular weight Mw is determined by means of GPC (=gel permeation chromatography) against an internal polystyrene standard.

In some embodiments of the present invention, the glass transition temperature (Tg) of the transparent polymer is 70° C. or more and 250° C. or less.

Tg can be measured based on changes in the heat capacity observed in Differential scanning colorimetry like described in http://pslc.ws/macrog/dsc.htm, Rickey J Seyler, Assignment of the Glass Transition, ASTM publication code number (PCN) 04-012490-50.

For examples, as the transparent polymer for the transparent matrix material, poly(meth)acrylates, epoxides, polyurethanes, polysiloxanes, can be used preferably.

In a preferred embodiment of the present invention, the weight average molecular weight (Mw) of the polymer as the transparent matrix material is in the range from 1,000 to 300,000. More preferably it is from 10,000 to 250,000.

Solvent Formulation

Another object of the present invention covers a formulation comprising one or more of the semiconductor nano-sized material or the composition as explained above and at least one solvent. These kinds of formulations are of interest in case the material is designated for coating on a specific surface.

Suitable solvents can be selected from the group consisting of purified water; ethylene glycol monoalkyl ethers, such as, ethylene glycol monomethyl ether, ethylene glycol monoethyl ether, ethylene glycol monopropyl ether, and ethylene glycol monobutyl ether; diethylene glycol dialkyl ethers, such as, diethylene glycol dimethyl ether, diethylene glycol diethyl ether, diethylene glycol dipropyl ether, and diethylene glycol dibutyl ether; ethylene glycol alkyl ether acetates, such as, methyl cellosolve acetate and ethyl cellosolve acetate; propylene glycol alkyl ether acetates, such as, propylene glycol monomethyl ether acetate (PGMEA), propylene glycol monoethyl ether acetate, and propylene glycol monopropyl ether acetate; ketones, such as, methyl ethyl ketone, acetone, methyl amyl ketone, methyl isobutyl ketone, and cyclohexanone; alcohols, such as, ethanol, propanol, butanol, hexanol, cyclo hexanol, ethylene glycol, and glycerin; esters, such as, ethyl 3-ethoxypropionate, methyl 3-methoxypropionate and ethyl lactate; and cyclic asters, such as, γ-butyro-lactone; chlorinated hydrocarbons, such as chloroform, dichloromethane, chlorobenzene, dichlorobenzene.

Also preferred are solvents selected from one or more members of the group consisting of aromatic, halogenated and aliphatic hydrocarbons solvents, more preferably selected from one or more members of the group consisting of toluene, xylene, ethers, tetrahydrofuran, chloroform, dichloromethane and heptane.

Those solvents are used singly or in combination of two or more, and the amount thereof depends on the coating method and the thickness of the coating.

More preferably, propylene glycol alkyl ether acetates, such as, propylene glycol monomethyl ether acetate (hereafter "PGMEA"), propylene glycol monoethyl ether acetate, propylene glycol monopropyl ether acetate, purified water or alcohols can be used.

Even more preferably, purified water can be used.

The amount of the solvent in the formulation can be freely controlled according to further treatments. For example, if the formulation is designated to be spray-coated, it can contain the solvent in an amount of 90 wt. % or more. Further, if a slit-coating method, which is often adopted in coating a large substrate, is to be carried out, the content of the solvent is normally 60 wt. % or more, preferably 70 wt. % or more.

Devices

The present invention is also directed to the use of the semiconductor nano-sized light emitting material of the present invention in an electronic device, optical device or in a biomedical device as for example In some embodiments of the present invention, the optical device can be a liquid crystal display, Organic Light Emitting Diode (OLED), backlight unit for display, Light Emitting Diode (LED), Micro Electro Mechanical Systems (here in after "MEMS"), electro wetting display, or an electrophoretic display, a lighting device, and/or a solar cell.

The present invention also covers an optical medium comprising the semiconductor nano-sized light emitting material, the composition or the formulation each of them as explained above.

Finally, the present invention also refers to an optical device comprising said optical medium as explained above.

FURTHER EMBODIMENTS

Embodiment 1: A semiconductor nano-sized light emitting material comprising or consisting of a core, optionally one or more shell layers and a ligand coated onto the core or the outermost surface of the shell layers, wherein the ligand is one or more metal phosphonate and/or derivatives thereof, and wherein the metal phosphonate follows one of the following structures according to formula (I), (II), (III), (IV) and/or (V)

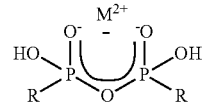

(I)

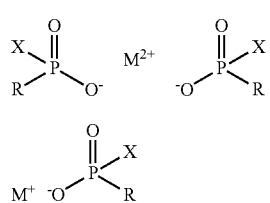

(II)

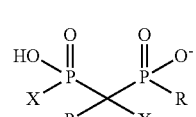

(III)

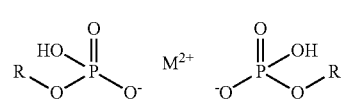

(IV)

(V)

wherein R is selected from the group consisting of alkyl, alkenyl, alkynyl, aryl and alkylaryl and wherein R comprises at least 2 and not more than 20 carbon atoms, and wherein X is selected from the group consisting of hydroxyl, ester and ether.

Embodiment 2: The semiconductor nano-sized light emitting material according to embodiment 1, wherein the metal phosphonate follows one of the following structures according to formula (I), (II), (III), (IV) and/or (V), and wherein R further comprises at least one functional group selected from the group consisting of hydroxyl, carbonyl, carboxyl, ether, ester, amino, thio, silyl, sulfo and halogen.

Embodiment 3: The semiconductor nano-sized light emitting material according to embodiment 1 or 2, wherein the metal cation used for the metal phosphonate is selected from the group consisting of: Mg, Ca, Ba, Cu, Fe, Zn or their mixtures.

Embodiment 4: The semiconductor nano-sized light emitting material according to any of embodiments 1 to 3, wherein the metal cation used for the metal phosphonate is Mg and/or Zn.

Embodiment 5: The semiconductor nano-sized light emitting material according to any of embodiments 1 to 4, wherein the metal cation used for the metal phosphonate is Zn.

Embodiment 6: The semiconductor nano-sized light emitting material according to any of embodiments 1 to 5, wherein said semiconductor nano-sized light emitting material comprises or consists of a core and optionally one or more shell layers wherein said core is formed from one, two or more compounds according to formula (VI),

[A$^1$B$^1$]  (VI)

in which

[A$^1$] stands for a metal selected from the group consisting of zinc, cadmium, indium or their mixtures;

[B$^1$] stands for a non-metal selected form the group consisting of sulphur, selenium, phosphorous or their mixtures.

Embodiment 7: The semiconductor nano-sized light emitting material of embodiment 6, wherein [A$^1$B$^1$] stands for one, two or more compounds selected from the group consisting of CdS, CdSe, CdSeS, CdZnS, ZnS, ZnSe, ZnSeS, and InP.

Embodiment 8: The semiconductor nano-sized light emitting material according to embodiment 6, wherein

[A$^1$] stands for indium; and

[B$^1$] stands for phosphorous.

Embodiment 9: The semiconductor nano-sized light emitting material according to any of embodiments 1 to 7, wherein said shell of said semiconductor nano-sized light emitting material is formed from one, two or more compounds according to formula (VII)

$$[A^2B^2] \quad (VII)$$

in which

[$A^2$] stands for a metal selected from the group consisting of zinc, cadmium or their mixtures;

[$B^2$] stands for a non-metal selected form the group consisting of sulphur, selenium, or their mixtures.

Embodiment 10: The semiconductor nano-sized light emitting material according to embodiment 9, wherein [$A^2B^2$] stands for one, two or more compounds selected from the group consisting of CdS, CdSe, CdSeS, CdZnS, ZnS, ZnSe and ZnSeS, ZnSeSTe.

Embodiment 11: The semiconductor nano-sized light emitting material of embodiment 10, wherein said semiconductor nano-sized light emitting material comprises a core shell structure of the core [$A^1B^1$] and at least one shell [$A^2B^2$], said core/shell structure [$A^1B^1$]/[$A^2B^2$] being selected from the group consisting of CdSeS/CdZnS
CdSe/ZnS
InP/ZnS
InP/ZnSe
InP(Zn)/ZnSe
ZnSe/CdS
ZnSe/ZnS or their mixtures.

Embodiment 12: A process for manufacturing a semiconductor nano-sized light emitting material comprising or consisting of a core, optionally one or more shell layers and metal phosphonate acid and/or derivatives thereof coated onto the core or the outermost surface of the shell layers, comprising or consisting of the following steps:

(a) providing at least one salt of at least one metal [$A^1$] and/or [$A^2$] optionally dissolved in a suitable solvent;
(b) adding at least one source of at least one non-metal [$B^1$] and/or [$B^2$] to obtain an intermediate compound [$A^1B^1$] or [$A^1B^1$]/[$A^2B^2$];
(c) coating said intermediate compound [$A^1B^1$]/[$A^2B^2$] from step (b), optionally in the presence of a solvent, by bringing it into contact with a source of metal phosphonate and/or derivatives thereof, and optionally
(d) subjecting said coated intermediate of step (c) to illumination with light with a peak light wavelength of about 300 to about 650 nm to increase quantum yield of the nano-sized material.

Embodiment 13: The process of embodiment 12, wherein illumination is carried out using light with a peak light wavelength of about 365 to about 470 nm and/or intensities of about 0.025 to about 1 Wcm$^{-2}$.

Embodiment 14: A semiconductor nano-sized light emitting material comprising or consisting of a core, optionally one or more shell layers and a ligand coated onto the core or the outermost surface of the shell layers, obtainable or obtained by the following steps:

(a) providing at least one salt of at least one metal [$A^1$] and/or [$A^2$] optionally dissolved in a suitable solvent;
(b) adding at least one source of at least one non-metal [$B^1$] and/or [$B^2$] to obtain an intermediate compound [$A^1B^1$]/[$A^2B^2$];
(c) coating said intermediate compound [$A^1B^1$]/[$A^2B^2$] from step (b), optionally in the presence of a solvent, by bringing it into contact with a source of a metal phosphonate and/or derivatives thereof wherein the metal phosphonate follows one of the following structures according to formula (I), (II), (III), (IV) and/or (V)

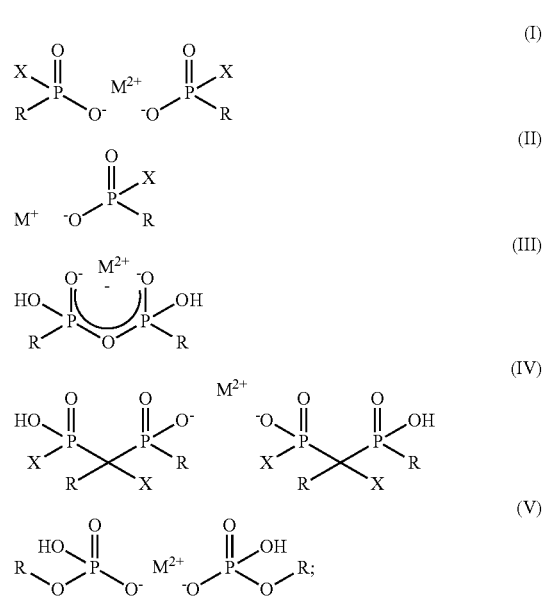

and optionally
(d) subjecting said coated intermediate of step (c) to illumination with light with a peak light wavelength of about 300 to about 650 nm to increase quantum yield of the nano-sized material.

Embodiment 15: A composition comprising at least one semiconductor nano-sized light emitting material according to any one of embodiments 1 to 11, 14, and at least one additional matrix material.

Embodiment 16: A formulation comprising one or more of the semiconductor nano-sized material according to any one of embodiments 1 to 11, 14, or the composition in embodiment 15, and at least one solvent.

Embodiment 17: The use of the semiconductor nano-sized light emitting material according to any one of embodiments 1 to 11, 14, or the composition in embodiment 15 or the formulation of embodiment 16, in an electronic device, optical device or in a biomedical device.

Embodiment 18: An optical medium comprising the semiconductor nano-sized light emitting according to any one of embodiments 1 to 11, 14, or the composition in embodiment 15 or the formulation of embodiment 16.

Embodiment 19: An optical device comprising said optical medium according to embodiment 18.

EXAMPLES

Several semiconductors are prepared and subjected to surface treatment. Subsequently they are irradiated to measure quantum yields.

For illumination, a lighting setup built with Philips Fortimo 3000 lm 34 W 4000K LED downlight module (phosphor disc removed). A 1.9 nm thick Perspex Pane® is placed on its top. The distance between the LEDs and the Perspex Pane® is 31.2 mm. The 20 ml sealed sample vials are placed on the Perspex Pane® inside a plastic cylinder (diameter 68 mm, height 100 mm). A photo enhancement system with sealed sample vials inside the cylinder is used.

The vials with the solution of QDs are placed on the Perspex and illuminated from below. Optionally, to prevent the solution from extensive heating and evaporation of the solvent, the vials are placed in the water bath. The peak wavelength of the illumination is 455 nm. The irradiance at 450 nm is measured by an Ophir Nova II® and PD300-UV photodetector and measured to be 300 mW/cm².

Example 1

Synthesis of InP/ZnSe 112 mg of $InI_3$, and 150 mg $ZnCl_2$ are dissolved in 2.5 mL oleylamine. At 180° C. 0.22 mL of hexaethylphosphorous triamide $(DEA)_3P$) is added to the solution and is kept at this temperature for 20 min. After 20 min, 0.55 mL of anion shell precursor (2M TOP:Se) is added slowly in the solution. The solution is then heated stepwise, followed by successive injections of cation (2.4 mL of 0.4M Zn-acetate in oleylamine) and anion (0.38 mL of 2M TOP:Se) shell precursor at temperatures between 200° C. and 320° C.

Example 2

Synthesis and Purification of Zn-ODPA Precursor 33 mg (1.5 mmol) of zinc acetate dehydrate (Zn(Ac)2) (99.99% purity, CAS #557-34-6, 383317-100G Sigma-Aldrich), 1.25 gr (3.75 mmol) of octadecylphosphonic acid (ODPA) (~90% purity, PCI, Lot #350001N11-B, 250 gr) and 3 gr of 1-Octadecene (ODE) (90% purity, CAS #112-88-9, O806-1L Sigma-Aldrich) are added in to flask of 50 ml.

The continuously stirred mixture is degassed at 130° C. for 2 hours. Then Argon is inserted, and temperature is increased up to 330° C. The solution becomes clear at ~280° C. Further, the solution is continuously stirred and heated at 330° C. for 30 minutes.

Afterwards the solution, i.e. Zn-ODPA in ODE is cooled to room temperature. In order to clean raw Zn-ODPA precursor from ODE and from unreacted zinc acetate, ethyl acetate is used. Samples with cleaned Zn-ODPA and pure ODPA are analyzed using Mass-spectra Analysis, Thermogravimetric Analysis and P-NMR.

TABLE 1 shows the content of purified Zn-ODPA samples.

| Compound | Content (%) |
| --- | --- |
| Znx[ODPA]y | 66.7 |
| Znx[ODPA ester]y | 10.5 |
| Unreacted Zinc | 16.1 |
| Other contaminations | 6.7 |

Example 3

Zn-ODPA Photo-Deposition+Characterization Method 2 ml of the sample from example 1 is purified from access ligands using centrifugation and toluene and ethanol as solvent/anti-solvent. 96 mg of the precipitant was dissolved in 1 ml of hexanes or toluene (anhydrous). This solution is placed under blue illumination for 48 hours.

After 48 hours the quantum yields of the sample is measured using Hamamatsu absolute quantum yield spectrometer (model: Quantaurus C11347).

Example 4

60 mg of cleaned and dried Zn-ODPA ligands are dissolved in 4 ml of anhydrous toluene. Sonication (10 min) and hot water bath (~70° C.) are applied to accelerate dissolving Zn-ODPA in toluene. QDs (concentration 6.5 mg/ml) from comparative example 1 are combined with the Zn-ODPA and stirred for 72 hours.

This solution is placed under blue illumination for 48 hours. After 48 hours the quantum yields of the sample is measured using Hamamatsu absolute quantum yield spectrometer (model: Quantaurus C11347).

Experimental Results

Table 2 shows the quantum yield (QY) measurement summary for the treated samples with and without Zn-ODPA.

TABLE 2

| Samples | QY (%) |
| --- | --- |
| Example 3 | 25% |
| Example 4 | 60% |

It clearly shows that the QY of the QDs treated with Zn-ODPA is 35% higher than the QY of the untreated QDs.

The invention claimed is:

1. A semiconductor nano-sized light emitting material comprising a core, optionally one or more shell layers and a ligand coated onto the core or the outermost surface of the shell layers, wherein the ligand is one or more metal phosphonate and/or derivatives thereof, and wherein the metal phosphonate follows one of the following structures according to formula (I), (II), (III), (IV) and/or (V)

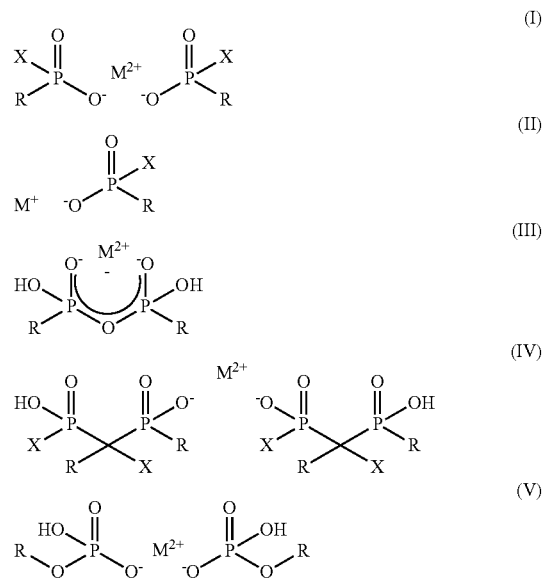

wherein $M^{2+}$ is a metal cation that is Mg, Ca, Ba, Cu, Fe, Zn or their mixtures, and $M^+$ is a metal cation that is Cu, R is selected from the group consisting of alkyl, alkenyl, alkynyl, aryl and alkylaryl and wherein R comprises at least 2 and not more than 20 carbon atoms, and wherein X is selected from the group consisting of hydroxyl, ester and ether.

2. The material according to claim 1, wherein the metal phosphonate follows one of the following structures according to formula (I), (II), (III), (IV) and/or (V), and
wherein R further comprises at least one functional group selected from the group consisting of hydroxyl, carbonyl, carboxyl, ether, ester, amino, thio, silyl, sulfo and halogen.

3. The material according to claim 1, wherein the metal cation $M^{2+}$ used for the metal phosphonate is Mg and/or Zn.

4. The material according to claim 1, wherein the metal cation $M^{2+}$ used for the metal phosphonate is Zn.

5. The material according to claim 1, wherein said semiconductor nano-sized light emitting material comprises a core and optionally one or more shell layers
wherein said core is formed from one, two or more compounds according to formula (VI), $$[A^1B^1] \quad (VI)$$

in which
[$A^1$] stands for a metal selected from the group consisting of zinc, cadmium, indium or their mixtures;
[$B^1$] stands for a non-metal selected form the group consisting of sulphur, selenium, phosphorous or their mixtures.

6. The semiconductor nano-sized light emitting material of claim 5, wherein [$A^1B^1$] stands for one, two or more compounds selected from the group consisting of CdS, CdSe, CdSeS, CdZnS, ZnS, ZnSe, ZnSeS, and InP.

7. The semiconductor nano-sized light emitting material according to claim 5, wherein
[$A^1$] stands for indium; and
[$B^1$] stands for phosphorous.

8. The material according to claim 1, wherein said shell of said semiconductor nano-sized light emitting material is formed from one, two or more compounds according to formula (VII)

$$[A^2B^2] \quad (VII)$$

in which
[$A^2$] stands for a metal selected from the group consisting of zinc, cadmium or their mixtures;
[$B^2$] stands for a non-metal selected form the group consisting of sulphur, selenium, tellurium or their mixtures.

9. The material according to claim 8, wherein [$A^2B^2$] stands for one, two or more compounds selected from the group consisting of CdS, CdSe, CdSeS, CdZnS, ZnS, ZnSe and ZnSeS, ZnSeSTe.

10. The material of claim 9, wherein said semiconductor nano-sized light emitting material comprises a core shell structure of the core [$A^1B^1$] and at least one shell [$A^2B^2$], said core/shell structure [$A^1B^1$]/[$A^2B^2$] being selected from the group consisting of
CdSeS/CdZnS
CdSe/ZnS
InP/ZnS
InP/ZnSe
InP(Zn)/ZnSe
ZnSe/CdS
ZnSe/ZnS
or their mixtures.

11. A process for manufacturing a semiconductor nano-sized light emitting material comprising a core, optionally one or more shell layers and metal phosphonate acid and/or derivatives thereof coated onto the core or the outermost surface of the shell layers,
comprising the following:
(a) providing at least one salt of at least one metal [$A^1$] and/or [$A^2$] optionally dissolved in a suitable solvent;
(b) adding at least one source of at least one non-metal [$B^1$] and/or [$B^2$] to obtain an intermediate compound [$A^1B^1$] or [$A^1B^1$]/[$A^2B^2$];
(c) coating said intermediate compound [$A^1B^1$]/[$A^2B^2$] from (b), optionally in the presence of a solvent, by bringing it into contact with a source of metal phosphonate and/or derivatives thereof, and optionally
(d) subjecting said coated intermediate of (c) to illumination with light with a peak light wavelength of about 300 to about 650 nm to increase quantum yield of the nano-sized material,
wherein [$A^1$] stands for a metal selected from the group consisting of zinc, cadmium, indium and their mixtures;
[$B^1$] stands for a non-metal selected form the group consisting of sulphur, selenium, phosphorous and their mixtures,
[$A^2$] stands for a metal selected from the group consisting of zinc, cadmium or their mixtures;
[$B^2$] stands for a non-metal selected form the group consisting of sulphur, selenium, or their mixtures.

12. The process of claim 11, wherein illumination is carried out using light with a peak light wavelength of about 365 to about 470 nm and/or intensities of about 0.025 to about 1 $Wcm^{-2}$.

13. A semiconductor nano-sized light emitting material comprising a core, optionally one or more shell layers and a ligand coated onto the core or the outermost surface of the shell layers, obtained by the following:
(a) providing at least one salt of at least one metal [$A^1$] and/or [$A^2$] optionally dissolved in a suitable solvent;
(b) adding at least one source of at least one non-metal [$B^1$] and/or [$B^2$] to obtain an intermediate compound [$A^1B^1$]/[$A^2B^2$];
(c) coating said intermediate compound [$A^1B^1$]/[$A^2B^2$] from (b), optionally in the presence of a solvent, by bringing it into contact with a source of a metal phosphonate and/or derivatives thereof,
wherein the metal phosphonate follows one of the following structures according to formula (I), (II), (III), (IV) and/or (V)

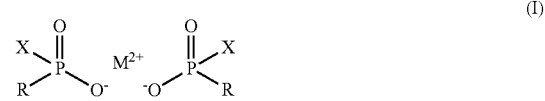
(I)

(II)

(III)

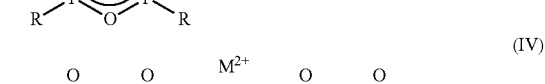
(IV)

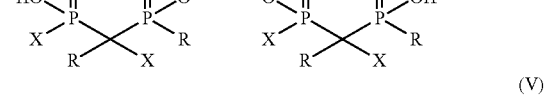
(V)

and optionally
- (d) subjecting said coated intermediate of (c) to illumination with light with a peak light wavelength of about 300 to about 650 nm to increase quantum yield of the nano-sized material, wherein $M^{2+}$ is Mg, Ca, Ba, Cu, Fe, Zn or their mixtures, and $M^+$ is Cu, R is selected from the group consisting of alkyl, alkenyl, alkynyl, aryl and alkylaryl and wherein R comprises at least 2 and not more than 20 carbon atoms, X is selected from the group consisting of hydroxyl, ester and ether, $[A^1]$ stands for a metal selected from the group consisting of zinc, cadmium, indium and their mixtures;

$[B^1]$ stands for a non-metal selected form the group consisting of sulphur, selenium, phosphorous and their mixtures, $[A^2]$ stands for a metal selected from the group consisting of zinc, cadmium and their mixtures; and $[B^2]$ stands for a non-metal selected form the group consisting of sulphur, selenium, and their mixtures.

14. A composition comprising at least one semiconductor nano-sized light emitting material according to claim 1, and at least one additional matrix material.

15. A formulation comprising one or more of the semiconductor nano-sized material according to claim 1, and at least one solvent.

16. An optical medium comprising in said medium the semiconductor nano-sized light emitting material according to claim 1.

17. An optical or electronic device comprising said optical medium according to claim 16.

18. The semiconductor nano-sized light emitting material according to claim 1, consisting of a core, optionally one or more shell layers and a ligand coated onto the core or the outermost surface of the shell layers.

\* \* \* \* \*